(12) United States Patent
Blair et al.

(10) Patent No.: US 11,567,109 B2
(45) Date of Patent: Jan. 31, 2023

(54) CAPACITOR BANK CONTROL USING WIRELESS ELECTRICAL MEASUREMENT SENSORS AWAY FROM CAPACITOR BANK

(71) Applicant: Schweitzer Engineering Laboratories, Inc., Pullman, WA (US)

(72) Inventors: Jeremy William Blair, Jackson, MS (US); Raymond W. Rice, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 192 days.

(21) Appl. No.: 16/775,649

(22) Filed: Jan. 29, 2020

(65) Prior Publication Data

US 2021/0109138 A1    Apr. 15, 2021

Related U.S. Application Data

(60) Provisional application No. 62/913,987, filed on Oct. 11, 2019.

(51) Int. Cl.
| | |
|---|---|
| *G01R 19/25* | (2006.01) |
| *G05B 15/02* | (2006.01) |
| *G01R 15/14* | (2006.01) |

(52) U.S. Cl.
CPC ......... *G01R 19/2513* (2013.01); *G05B 15/02* (2013.01); *G01R 15/14* (2013.01)

(58) Field of Classification Search
None
See application file for complete search history.

(56) References Cited

U.S. PATENT DOCUMENTS

| | | |
|---|---|---|
| 3,626,281 A | 12/1971 | Souillard |
| 3,859,564 A | 1/1975 | Zulaski |
| 3,909,672 A | 9/1975 | Lundquist |
| 4,689,752 A | 8/1987 | Fernandes et al. |
| 4,709,339 A | 11/1987 | Fernandes |
| 4,794,328 A | 12/1988 | Fernandes |
| 5,168,414 A | 12/1992 | Horstmann |
| 5,220,311 A | 6/1993 | Schweitzer |
| 5,420,502 A | 5/1995 | Schweitzer |
| 5,428,549 A | 6/1995 | Chen |

(Continued)

OTHER PUBLICATIONS

Dhillon, Malkiat S.; Tziouvaras, Demetrios A.: "Protection of Fuseless Capacitor Banks Using Digital Relays" Oct. 11, 1999.

(Continued)

*Primary Examiner* — Daniel C Puentes
(74) *Attorney, Agent, or Firm* — Fletcher Yoder, P.C.; Richard M. Edge (57) ABSTRACT

Systems, methods, and devices are provided to control an electrical component of an electric power distribution system with an intelligent electronic device using electrical measurements from a wireless electrical measurement device located away from the electrical component. One such system includes a capacitor bank on a lateral of an electric power distribution system, a first set of one or more wireless electrical measurement devices that obtain one or more electrical measurements of a first feeder of the electric power distribution system, and a capacitor bank controller. The capacitor bank controller may use the one or more electrical measurements of the first feeder to control the capacitor bank on the lateral.

14 Claims, 7 Drawing Sheets

(56) References Cited

U.S. PATENT DOCUMENTS

| | | | |
|---|---|---|---|
| 5,515,227 A | 5/1996 | Roberts | |
| 5,550,476 A | 8/1996 | Lau | |
| 5,565,783 A | 10/1996 | Lau | |
| 5,656,931 A | 8/1997 | Lau | |
| 5,862,186 A | 1/1999 | Kumar | |
| 6,002,260 A | 12/1999 | Lau | |
| 6,014,301 A | 1/2000 | Schweitzer | |
| 6,016,105 A | 1/2000 | Schweitzer | |
| 6,133,723 A | 10/2000 | Feight | |
| 6,133,724 A | 10/2000 | Schweitzer | |
| 6,429,661 B1 | 8/2002 | Schweitzer | |
| 6,433,698 B1 | 8/2002 | Schweitzer | |
| 6,479,981 B2 | 11/2002 | Schweitzer | |
| 6,518,767 B1 | 2/2003 | Roberts | |
| 6,525,543 B1 | 2/2003 | Roberts | |
| 6,721,671 B2 | 4/2004 | Roberts | |
| 6,734,662 B1 | 5/2004 | Fenske | |
| 6,760,670 B2 | 7/2004 | Stoupis | |
| 6,785,105 B2 | 8/2004 | Roberts | |
| 6,822,576 B1 | 11/2004 | Feight | |
| 6,894,478 B1 | 5/2005 | Fenske | |
| 6,901,242 B2 | 5/2005 | Kroeger | |
| 6,934,654 B2 | 8/2005 | Benmouyal | |
| 6,949,921 B1 | 9/2005 | Feight | |
| 6,963,197 B1 | 11/2005 | Feight | |
| 7,053,601 B1 | 5/2006 | Fenske | |
| 7,106,048 B1 | 9/2006 | Feight | |
| 7,271,580 B1 | 9/2007 | Fenske | |
| 7,315,169 B1 | 1/2008 | Fenske | |
| 7,345,488 B2 | 3/2008 | Fischer | |
| 7,382,272 B2 | 6/2008 | Feight | |
| 7,616,005 B2 | 11/2009 | Kalyuzhny | |
| 7,725,295 B2 | 5/2010 | Stoupi | |
| 7,729,405 B2 | 6/2010 | Inoue | |
| 8,059,006 B2 | 11/2011 | Schweitzer | |
| 8,575,941 B2 | 11/2013 | Samineni | |
| 8,650,411 B2 | 2/2014 | Feight | |
| 8,665,102 B2 | 3/2014 | Salewske | |
| 10,419,064 B2 | 11/2019 | Cosic | |
| 2004/0021995 A1 | 2/2004 | Roberts | |
| 2005/0083206 A1* | 4/2005 | Couch | G01R 21/133 340/657 |
| 2005/0243491 A1 | 11/2005 | Tanis | |
| 2008/0007230 A1* | 1/2008 | Kalyuzhny | H02J 3/24 323/205 |
| 2008/0109205 A1 | 5/2008 | Nasle | |
| 2009/0073726 A1 | 3/2009 | Babcock | |
| 2014/0119331 A1 | 5/2014 | Ji | |
| 2015/0177306 A1* | 6/2015 | Hedlund | G01R 31/64 324/548 |
| 2021/0102985 A1* | 4/2021 | Hao | G01R 31/64 |

OTHER PUBLICATIONS

Brunello, Gustavo; Kasztenny, Bogdan; Wester, Craig: "Shunt Capacitor Bank Fundamentals and Protection" Apr. 8-10, 2003.

Edmund O. Schweitzer, III and Jolene Schafman, "Unified Shunt Capacitor Bank Control and Protection" Oct. 1990.

Satish Samineni, Casper Labuschagne, and Jeff Pope, "Principles of Shunt Capacitor Bank Application and Protection" Oct. 2009.

Joseph Schaefer, Satish Samineni, Casper Labuschagne, Steven Chase, and Dereje Jada Hawaz, "Minimizing Capacitor Bank Outage Time Through Fault Location" Oct. 2013.

* cited by examiner

CAPACITOR BANK CONTROL USING WIRELESS ELECTRICAL MEASUREMENT SENSORS AWAY FROM CAPACITOR BANK

CROSS REFERENCE TO RELATED APPLICATIONS

This application claims priority from and the benefit of U.S. Provisional Application Ser. No. 62/913,987, entitled "CAPACITOR BANK CONTROL USING WIRELESS ELECTRICAL MEASUREMENT SENSORS AWAY FROM CAPACITOR BANK," filed Oct. 11, 2019, which is hereby incorporated by reference in its entirety for all purposes.

BACKGROUND

The present disclosure relates generally relates to controlling an electric power distribution system. More particularly, this disclosure relates to controlling a capacitor bank using electrical measurements from wireless electrical measurement devices, such as wireless current sensors (WCSs), disposed away from the capacitor bank.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electric power distribution systems carry electricity from a transmission system to residential communities, factories, industrial areas, and other electricity consumers. Current transformers may be used to reduce higher-voltage currents to lower values, enabling measurements of the electrical current flowing through electric power lines. Current transformers may provide these measurements to IEDs for applications such as protective relaying, electrical load surveying, verification of circuit energization, cost allocation, capacitor bank control, and demand alarming. IEDs operating as capacitor bank controllers generally receive electrical measurements from electrical measurement devices near a capacitor bank. The capacitor bank controller may control the capacitor bank to adjust an aspect of the electric power distribution system, such as to maintain a target voltage-ampere-reactive (VAR) demand, power factor, or phase shift. For example, the capacitor bank controller may cause capacitors of the capacitor bank to be generally connected to a power line when a higher level of compensation may be useful to maintain a target VAR demand level and then disconnected when a lower level of compensation may be useful to maintain the target VAR demand level.

The capacitor bank controller may use a closed-loop control method to control the aspect of the electric power distribution system at the location of the capacitor bank using electrical measurements obtained from that location. Thus, to control a trunk or feeder line, the capacitor bank may be located on the trunk or feeder line and the capacitor bank controller may use electrical measurements obtained near the capacitor bank as closed-loop feedback. It may not always be possible to place a capacitor bank on a trunk or feeder, however, particularly in the case of increasingly dense urban growth. In that case, a capacitor bank may be installed on a lateral line away from the trunk or feeder line. But since the electrical measurements are obtained near the site of the capacitor bank, the capacitor bank controller may use an open-loop control method to attempt to control an aspect of the trunk or feeder line by operating the capacitor bank on the lateral line. Open loop methods, such as time, temperature, or voltage methods, may be used. Open loop methods, however, may be less precise or less accurate, as well as potentially more complex, than closed-loop methods.

SUMMARY

Certain examples commensurate in scope with the originally claimed subject matter are discussed below. These examples are not intended to limit the scope of the disclosure. Indeed, the present disclosure may encompass a variety of forms that may be similar to or different from the examples set forth below.

In one example, a system includes a capacitor bank coupled to a lateral of an electric power distribution system, a first set of one or more wireless electrical measurement devices that obtain one or more electrical measurements of a first feeder of the electric power distribution system, and a capacitor bank controller. The capacitor bank controller may receive the one or more electrical measurements of the first feeder from the first set of one or more wireless electrical measurement devices and control the capacitor bank using the one or more electrical measurements of the first feeder.

In another example, one or more tangible, non-transitory, machine-readable media include instructions that, when executed by a processor of an intelligent electronic device that controls an electrical component of an electric power distribution system at a first location on the electric power distribution system, cause the processor to receive electrical measurements obtained at a second location of the electric power distribution system and control the electrical component at the first location based at least in part on the electrical measurements obtained at a second location.

In another example, a method includes installing a capacitor bank onto a lateral of an electric power distribution system, installing a first wireless current sensor on a first feeder of the electric power distribution system, and controlling the capacitor bank on the lateral using wireless electrical measurements obtained by the first wireless current sensor on the first feeder.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase "A or B" is intended to mean A, B, or both A and B.

Moreover, the embodiments of the disclosure will be best understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified. In some cases, well-known features, structures or operations are not shown or described in detail. Furthermore, the described features, structures, or operations may be combined in any suitable manner in one or more embodiments. The components of the embodiments as generally described and illustrated in the figures could be arranged and designed in a wide variety of different configurations.

In addition, several aspects of the embodiments described may be implemented as software modules or components. As used herein, a software module or component may include any type of computer instruction or computer-executable code located within a memory device and/or transmitted as electronic signals over a system bus or wired or wireless network. A software module or component may, for instance, include physical or logical blocks of computer instructions, which may be organized as a routine, program, object, component, data structure, or the like, and which performs a task or implements a particular data type.

In certain embodiments, a particular software module or component may include disparate instructions stored in different locations of a memory device, which together implement the described functionality of the module. Indeed, a module or component may include a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Moreover, some embodiments may be provided as a computer program product including a tangible, non-transitory, computer-readable and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, compact disc read-only memories (CD-ROMs), digital versatile disc read-only memories (DVD-ROMs), read-only memories (ROMs), random access memories (RAMs), erasable programmable read-only memories (EPROMs), electrically erasable programmable read-only memories (EEPROMs), magnetic or optical cards, solid-state memory devices, or other types of machine-readable media suitable for storing electronic and/or processor executable instructions.

Intelligent electronic devices (IEDs) may be used to control certain devices on an electric power distribution system. In examples discussed below, an IED may be a capacitor bank controller that controls a capacitor bank on an electric power distribution system. However, it should be appreciated that the systems and methods of this disclosure may employ any suitable IED to control any suitable device to control an aspect of an electric power distribution system. Thus, where the disclosure below refers to a capacitor bank controller that uses the systems and methods of this disclosure, this should be understood to encompass any other suitable IEDs to control any other suitable devices for an electric power distribution system. Likewise, where the disclosure refers to wireless current sensors (WCSs) that may provide current measurements, this should be understood to encompass any other suitable electrical measurement devices that wirelessly transmit electrical measurements in wireless messages.

As mentioned above, one type of electrical measurement device is a current transformer. A current transformer may be used to reduce higher-voltage currents to lower values, enabling measurements of the electrical current flowing through electric power lines. Current transformers may provide these measurements to IEDs for applications such as protective relaying, electrical load surveying, verification of circuit energization, cost allocation, capacitor bank control, and demand alarming. Some wireless current transformers may operate using energy harvested from an electric power line, allowing them to operate without separate electrical wiring to a power source and/or without a battery or using a relatively smaller battery. Thus, unlike wired current transformers, which are connected to an IED by electrical wiring and tend to be located near an IED, wireless current sensors may be used to measure electrical current at sites on the electric power distribution system away from the IED.

As also noted above, an IED such as a capacitor bank controller may control a capacitor bank to adjust an aspect of the electric power distribution system, such as to maintain a target voltage-ampere-reactive (VAR) demand, power factor, or phase shift. For example, the capacitor bank controller may cause capacitors of the capacitor bank to be generally connected to a power line when a higher level of compensation may be useful to maintain a target VAR demand level and then disconnected when a lower level of compensation may be useful to maintain the target VAR demand level. Thus, capacitor banks provide compensation for the VAR demand of a feeder. However, a capacitor bank does not need to be connected directly to the feeder trunk to provide this compensation. In fact, a capacitor bank can provide the same or substantially similar compensation even if connected to a lateral line, which connects to the feeder trunk. This may accommodate a number of real-world circumstances owing to the congestion of equipment in certain parts of an electric power distribution system. For instance, sometimes the pole route of the feeder trunk is too congested to install more equipment. In that case, there may be no poles with space to accommodate a capacitor bank, or there may be no available location to set a new pole. Moreover, oftentimes the feeder trunk is located along high traffic roadways where it may be difficult to perform line work.

By receiving electrical measurements from a wireless electrical measurement device at a different location away from the capacitor bank, a capacitor bank controller may use a closed-loop control method to control an aspect of the electric power distribution system at a location using electrical measurements obtained from that location, even if that location is not especially near to the capacitor bank or capacitor bank controller. Indeed, a capacitor bank and capacitor bank controller may be located near a first site along electric power lines of the electric power distribution system, but may receive electrical measurements obtained from wireless electrical measurement devices at a second site. For example, this may allow the capacitor bank controller and a capacitor bank to be located on a less congested part of the electric power distribution system (e.g., a lateral line) but to control an electrical characteristic of a more congested part of the electric power distribution system (e.g., a feeder trunk).

Figure 1:
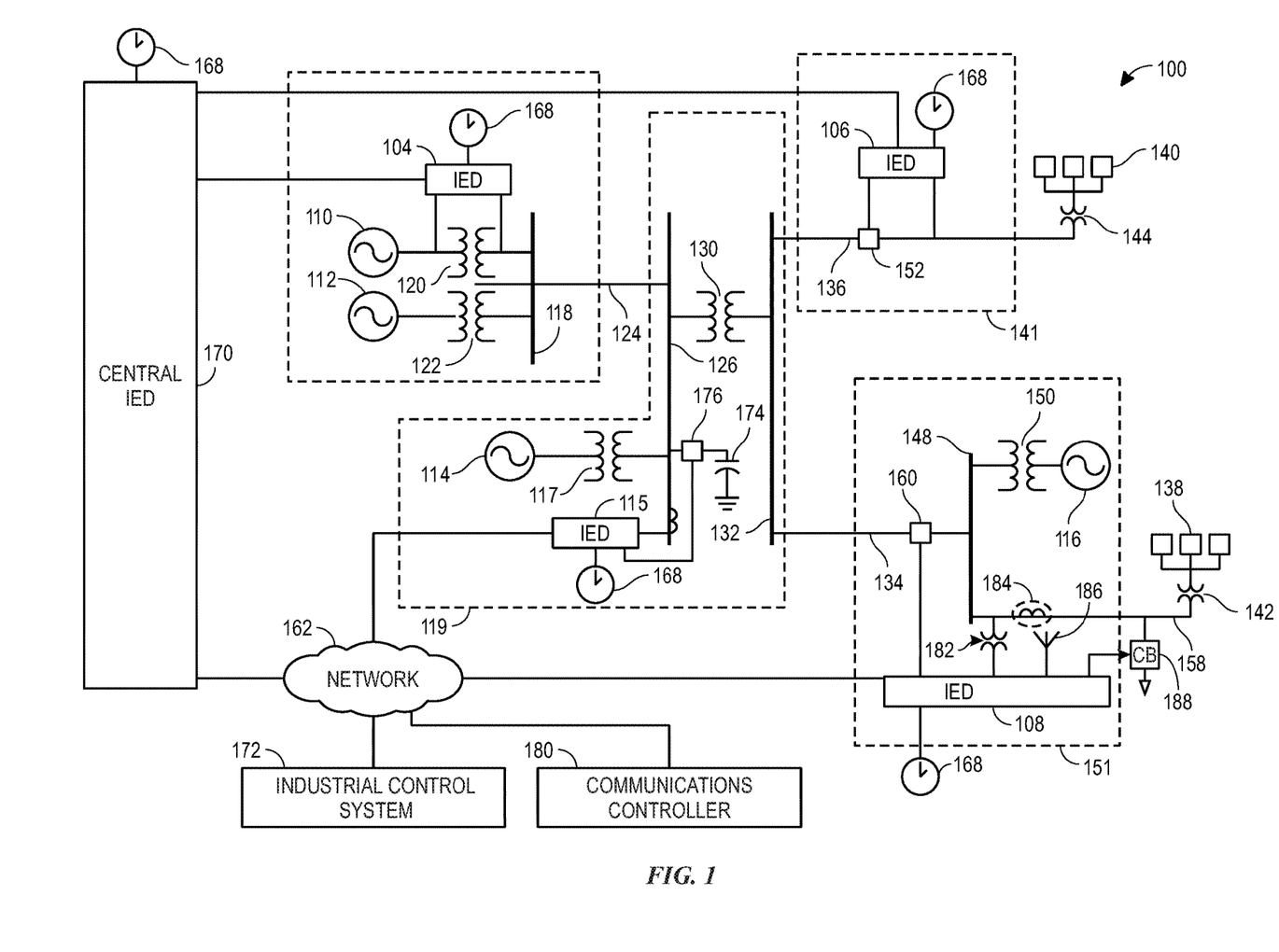
FIG. 1 is a simplified diagram of an electric power distribution system, in accordance with an embodiment.

FIG. 1 illustrates a simplified diagram of an electric power distribution system 100 that may use remote electrical measurements from a wireless electrical measurement device at a site away from an IED to allow the IED to control an aspect of the electric power distribution system 100 at that site. The electric power distribution system 100 may generate, transmit, and/or distribute electric energy to loads. As illustrated, the electric power distribution system 100 includes electric generators 110, 112, 114, and 116. The electric power distribution system 100 may also include power transformers 117, 120, 122, 130, 142, 144, and 150. Furthermore, the electric power delivery system may include lines 124, 134, 136, and 158 to transmit and/or deliver power, circuit breakers 152, 160, and 176 to control flow of power in the electric power distribution system 100, busses 118, 126, 132, and 148, and/or loads 138 and 140 to receive the power in and/or from the electric power distribution system 100. A variety of other types of equipment may also be included in electric power distribution system 100, such as current sensors (e.g., wireless current sensor (WCS) 184), potential transformers (e.g., potential transformer 182), voltage regulators, capacitors (e.g., capacitor 174) and/or capacitor banks (e.g., capacitor bank (CB) 188), antennas (e.g., antenna 186), and suitable other types of equipment useful in power generation, transmission, and/or distribution.

A substation 119 may include the electric generator 114, which may be a distributed generator, and which may be connected to the bus 126 through the power transformer 117 (e.g., step-up transformer). The bus 126 may be connected to a distribution bus 132 via the power transformer 130 (e.g., step-down transformer). Various electric power lines 136 and 134 may be connected to the distribution bus 132. The electric power line 136 may lead to a substation 141 where the electric power line 136 is monitored and/or controlled using an IED 106, which may selectively open and close circuit breaker 152. A load 140 may be fed from electric power line 136. The power transformer 144 (e.g., step-down transformer), in communication with the distribution bus 132 via electric power line 136, may be used to step down a voltage for consumption by the load 140.

An electric power line 134 may deliver electric power to a bus 148 of the substation 151. The bus 148 may also receive electric power from a distributed generator 116 via transformer 150. The electric power line 158 may deliver electric power from the bus 148 to a load 138, and may include the power transformer 142 (e.g., step-down transformer). A circuit breaker 160 may be used to selectively connect the bus 148 to the electric power line 134. The IED 108 may be used to monitor and/or control the circuit breaker 160 as well as the electric power line 158.

The electric power distribution system 100 may be monitored, controlled, automated, and/or protected using IEDs such as the IEDs 104, 106, 108, 115, and 170, and an industrial control system 172. In general, the IEDs in an electric power generation and transmission system may be used for protection, control, automation, and/or monitoring of equipment in the system. For example, the IEDs may be used to monitor equipment of many types, including electric power lines, electric power lines, current sensors, busses, switches, circuit breakers, reclosers, transformers, autotransformers, tap changers, voltage regulators, capacitor banks, generators, motors, pumps, compressors, valves, and a variety of other suitable types of monitored equipment.

As used herein, an IED (e.g., the IEDs 104, 106, 108, 115, and 170) may refer to any processing-based device that monitors, controls, automates, and/or protects monitored equipment within the electric power distribution system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system including multiple IEDs. Moreover, an IED of this disclosure may use a non-transitory computer-readable medium (e.g., memory) that may store instructions that, when executed by a processor of the IED, cause the processor to perform processes or methods disclosed herein. Moreover, the IED may include a wireless communication system to receive and/or transmit wireless messages from a wireless electrical measurement device. The wireless communication system of the IED may be able to communicate with a wireless communication system of the wireless electrical measurement devices, and may include any suitable communication circuitry for communication via a personal area network (PAN), such as Bluetooth or ZigBee, a local area network (LAN) or wireless local area network (WLAN), such as an 802.11x Wi-Fi network, and/or a wide area network (WAN), (e.g., third-generation (3G) cellular, fourth-generation (4G) cellular, universal mobile telecommunication system (UMTS), long term evolution (LTE), long term evolution license assisted access (LTE-LAA), fifth-generation (5G) cellular, and/or 5G New Radio (5G NR) cellular).

A common time signal may be distributed throughout the electric power distribution system 100. Utilizing a common time source may ensure that IEDs have a synchronized time signal that can be used to generate time synchronized data, such as synchrophasors. In various embodiments, the IEDs 104, 106, 108, 115, and 170 may receive a common time signal 168. The time signal may be distributed in the electric power distribution system 100 using a communications network 162 and/or using a common time source, such as a Global Navigation Satellite System ("GNSS"), or the like.

According to various embodiments, the industrial control system 172 may include one or more of a variety of types of systems. For example, the industrial control system 172 may include a supervisory control and data acquisition (SCADA) system and/or a wide area control and situational awareness (WACSA) system. A central IED 170 may be in communication with IEDs 104, 106, 108, and 115. IEDs 104, 106, 108 and 115 may be remote from the central IED 170, and may communicate over various media such as a direct communication from IED 106 or over a communications network 162. According to various embodiments, some IEDs may be in direct communication with other IEDs For example, the IED 104 may be in direct communication with the central IED 170. Additionally or alternatively, some IEDs may be in communication via the communications network 162. For example, the IED 108 may be in communication with the central IED 170 via the communications network 162.

Communication via the communications network 162 may be facilitated by networking devices including, but not limited to, multiplexers, routers, hubs, gateways, firewalls, and/or switches. In some embodiments, the IEDs and the network devices may include physically distinct devices. In certain embodiments, the IEDs and/or the network devices may be composite devices that may be configured in a variety of ways to perform overlapping functions. The IEDs and the network devices may include multi-function hardware (e.g., processors, computer-readable storage media, communications interfaces, etc.) that may be utilized to perform a variety of tasks that pertain to network communications and/or to operation of equipment within the electric power distribution system 100.

A communications controller 180 may interface with equipment in the communications network 162 to create a software-defined network (SDN) that facilitates communication between the IEDs 170, 115, and, 108 and the industrial control system 172. In various embodiments, the communications controller 180 may interface with a control plane (not shown) in the communications network 162. Using the control plane, the communications controller 180 may direct the flow of data within the communications network 162.

The communications controller 180 may receive information from multiple devices in the communications network 162 regarding transmission of data. In embodiments in which the communications network 162 includes fiber optic communication links, the data collected by the communications controller 180 may include reflection characteristics, attenuation characteristics, signal-to-noise ratio characteristics, harmonic characteristics, packet loss statics, and the like. In embodiments in which the communications network 162 includes electrical communication links, the data collected by the communications controller 180 may include voltage measurements, signal-to-noise ratio characteristics, packet loss statics, and the like. In some embodiments, the communications network 162 may include both electrical and optical transmission media. The information collected by the communications controller 180 may be used to assess a likelihood of a failure, to generate information about precursors to a failure, and to identify a root cause of a failure. The communications controller 180 may associate information regarding a status of various communication devices and communication links to assess a likelihood of a failure. Such associations may be utilized to generate information about the precursors to a failure and/or to identify root cause(s) of a failure consistent with embodiments of the present disclosure.

Some IEDs, such as the IED 108, may receive wireless messages from a wireless electrical measurement device, such as the wireless current sensor (WCS) 184. A wireless electrical measurement device such as the wireless current sensor (WCS) 184 may include a processor and non-transitory computer-readable media that may store instructions that, when executed by the processor, cause the processor to obtain the electrical measurements and transmit them wirelessly to an IED, such as the IED 108. To that end, the wireless current sensor (WCS) 184 may include a current transformer, a metering circuit, and a communication system to wireless transmit measurements. The current transformer of the wireless current sensor (WCS) 184 may include a coil that may be looped around one phase of a electric power line (such as the electric power line 158). The electrical current measurement of electric power line 158 may be obtained by measuring the electrical current induced in the coil of the current transformer using the metering circuitry; the induced current is proportional to the current flowing through the measured phase of the electric power line 158. In this way, the wireless current sensor (WCS) 184 may measure an electrical current of an electrical waveform carried by the electric power line 158. For example, the wireless current sensor (WCS) 184 may measure a current magnitude and a zero crossing of an alternating current (AC) electrical waveform on the electric power line 158. In some cases, there may be as many wireless current sensors (WCSs) 184 as there are phases of electrical power on the electric power line 158.

The wireless current sensor (WCS) 184 may send the electrical measurements as wireless messages to the IED 108 via an antenna 186. The IED 108 may also use a time signal 168 to help the IED 108 assess arrival times of the wireless messages received by the IED 108 from the wireless current sensor (WCS) 184. The wireless messages may take any suitable form and may be transmitted using any suitable protocol. To conserve bandwidth, in some embodiments, the wireless messages may contain a representation of the current magnitude measurement and may be sent at a particular time based on a time of a zero crossing measurement. In one example, the wireless current sensor (WCS) 184 may transmit a wireless message immediately upon a zero crossing, so that the IED 108 may identify the zero crossing based on the arrival time of the wireless message. In another example, the wireless current sensor (WCS) 184 may transmit a wireless message just prior to a zero crossing, so that the arrival time of the wireless message at the IED 108—taking into account latencies of message transmission and receipt—is expected to represent the present zero crossing of the electrical current carried on the electric power line 158.

In some embodiments, the IED 108 may operate as a capacitor bank controller (CBC) that may control a capacitor bank (CB) 188. The capacitor bank (CB) 188 may represent an electrical component of the electric power distribution system 100 that contains capacitors that can be selectively switched to connect to the electric power line 158. Because the capacitors of the capacitor bank (CB) 188 introduce a reactive load to the electric power line 158 when connected to the electric power line 158, the IED 108 may control the switching of the capacitors of the capacitor bank (CB) 188 to control, for example, a power factor and/or phase shift on the electric power line 158. In addition to current measurements from the wireless current sensor (WCS) 184, the IED 108 may also receive voltage measurements from a potential transformer 182.

As mentioned above, an IED may take the form of a capacitor bank controller that controls a capacitor bank. A capacitor bank controller may control a capacitor bank to control an electrical characteristic of the electric power distribution system, such as to maintain a target voltage-ampere-reactive (VAR) demand, power factor, or phase shift. One example appears in FIG. 2, which illustrates a capacitor bank controller (CBC) 202 that receives voltage measurements from potential transformers 204 via wired communication and electrical current measurements from one or more wireless current sensors (WCSs) 206 via wireless communication. The capacitor bank controller (CBC) 202 may cause capacitors 208 to be switched by switches 210 based on any suitable control method. Indeed, because the capacitor bank controller (CBC) 202 may receive messages containing measurements of electrical current at an antenna 212 that are transmitted from an antenna 214 of the wireless current sensor (WCS) 206, the capacitor bank controller (CBC) 202 may use a closed-loop control method based on the placement of the wireless current sensor (WCS) 206. Here, the wireless current sensor (WCS) 206 is shown to be located on a feeder 216 at a site 217A. For purposes of this disclosure, the site 217A may represent a location having any suitable size (e.g., less than a meter along the feeder 216, between one meter and five meters along the feeder 216, between 5 meters and 10 meters along the feeder 216).

Figure 2:
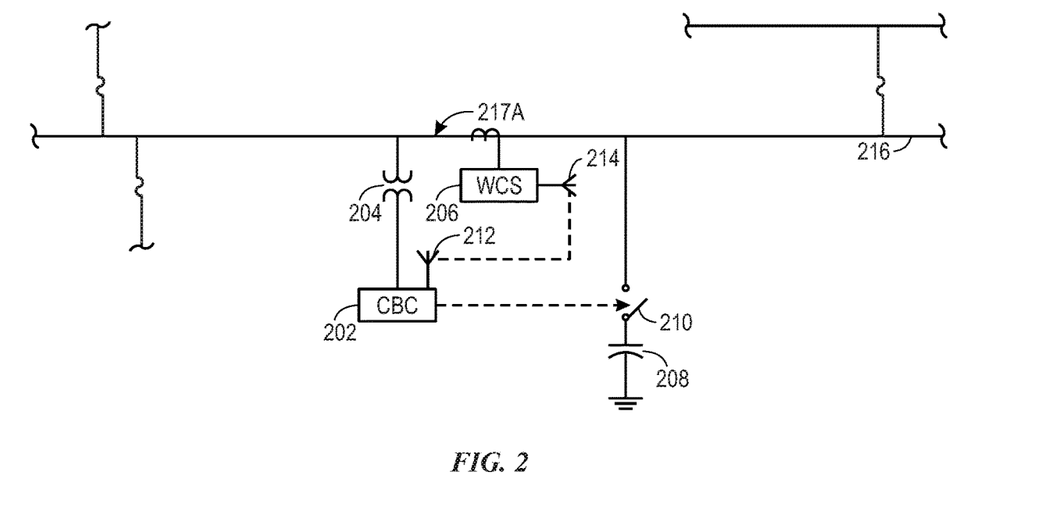
FIG. 2 is a one-line block diagram of a capacitor bank located on a feeder line with a nearby wireless current sensor, in accordance with an embodiment.

Because the wireless current sensor (WCS) 206 can supply electrical current measurements obtained remotely from the capacitor bank controller (CBC) 202, the wireless current sensor (WCS) 206 may be located some distance away. Thus, even when the capacitor bank controller (CBC) 202 and the capacitors 208 and switches 210 of the capacitor bank are located on a feeder 216 as shown in FIG. 2, the wireless current sensor (WCS) 206 may be apart by some distance. For example, the capacitor bank controller (CBC) 202 may receive messages containing measurements of electrical current at an antenna 212 that are transmitted from an antenna 214 of the wireless current sensor (WCS) 206. In some cases, the wireless current sensor (WCS) 206 may be apart from the capacitor bank controller (CBC) 202 and/or the potential transformers 204 by a few meters (e.g., 1, 2, 5, 10, 20, 50) to several hundred meters (e.g., 100, 200, 500, 1000, 2000, 5000). This may allow the capacitor bank controller (CBC) 202 to use a closed-loop method to control an aspect (e.g., VAR control) for a location on the feeder 216 where the wireless current sensors (WCSs) 206 are located, which may be some distance apart from where the capacitor bank controller (CBC) 202 is located.

Figure 3:
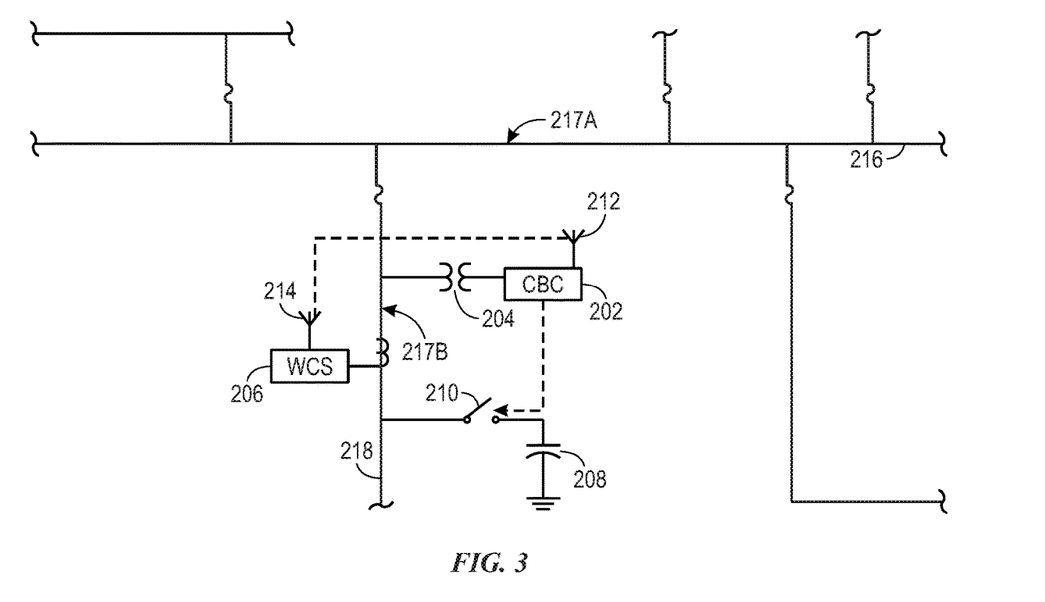
FIG. 3 is a one-line block diagram of a capacitor bank located on a lateral with a nearby wireless current sensor, in accordance with an embodiment.

In some cases, the capacitor bank controller (CBC) 202 and the capacitors 208 and switches 210 of the capacitor bank may be located on a lateral 218, as shown in FIG. 3. In FIG. 3, the potential transformers 204 and the wireless current sensors (WCSs) 206 are shown to obtain electrical measurements at a site 217B of the electric power distribution system along the lateral 218. For purposes of this disclosure, the site 217B may represent a location having any suitable size (e.g., less than a meter along the lateral 218, between one meter and five meters along the lateral 218, between 5 meters and 10 meters along the lateral 218). The wireless current sensors (WCSs) 206 may transmit messages containing the measurements of electrical current from the antennas 214 of the wireless current sensors (WCSs) 206 to the antenna 212 of the capacitor bank controller (CBC) 202. Moreover, in some cases, the wireless current sensors (WCSs) 206 may be apart from the capacitor bank controller (CBC) 202 and/or the potential transformers 204 by a few meters (e.g., 1, 2, 5, 10, 20, 50) to several hundred meters (e.g., 100, 200, 500, 1000, 2000, 5000). This may allow the capacitor bank controller (CBC) 202 to control an electrical behavior of the electric power distribution system (e.g., VAR control) for a location on the lateral 218 where the wireless current sensors (WCSs) 206 is located, which may be some distance apart from where the capacitor bank controller (CBC) 202. Indeed, the wireless current sensors (WCSs) 206 may be located on the lateral 218, but closer to an area of interest in the electric power distribution system, such as closer to the feeder 216 than where the capacitor bank controller (CBC) 202 is located.

Figure 4:
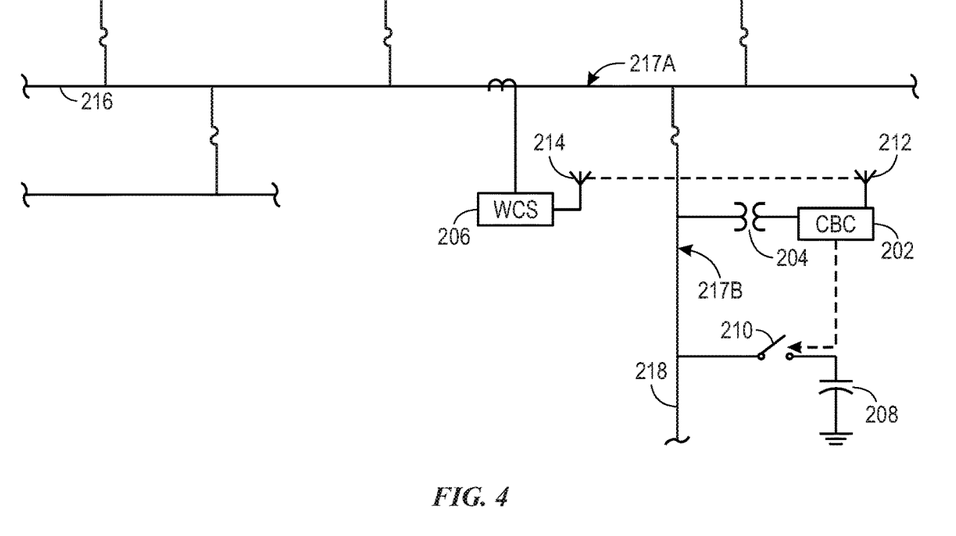
FIG. 4 is a one-line block diagram of a capacitor bank located on a lateral and controlled using electrical measurements from a wireless current sensor located on a feeder, in accordance with an embodiment.

In an example shown in FIG. 4, the wireless current sensors (WCSs) 206 may be located on the feeder 216 while the capacitor bank controller (CBC) 202 and the capacitors 208 and switches 210 of the capacitor bank are located on the lateral 218. Thus, the potential transformers 204 may obtain electrical measurements at the site 217B of the electric power distribution system along the lateral 218. The wireless current sensors (WCSs) 206 may obtain electrical current measurements at the site 217A. The wireless current sensors (WCSs) 206 may transmit messages containing the measurements of electrical current from the antennas 214 of the wireless current sensors (WCSs) 206 to the antenna 212 of the capacitor bank controller (CBC) 202. In this way, the capacitor bank controller (CBC) 202 may use a closed-loop control method to control an aspect (e.g., VAR control) for the site 217A on the feeder 216, even while the capacitor bank controller (CBC) 202 and the capacitors 208 and switches 210 of the capacitor bank are located near the site 217B on the lateral 218.

Figure 5:
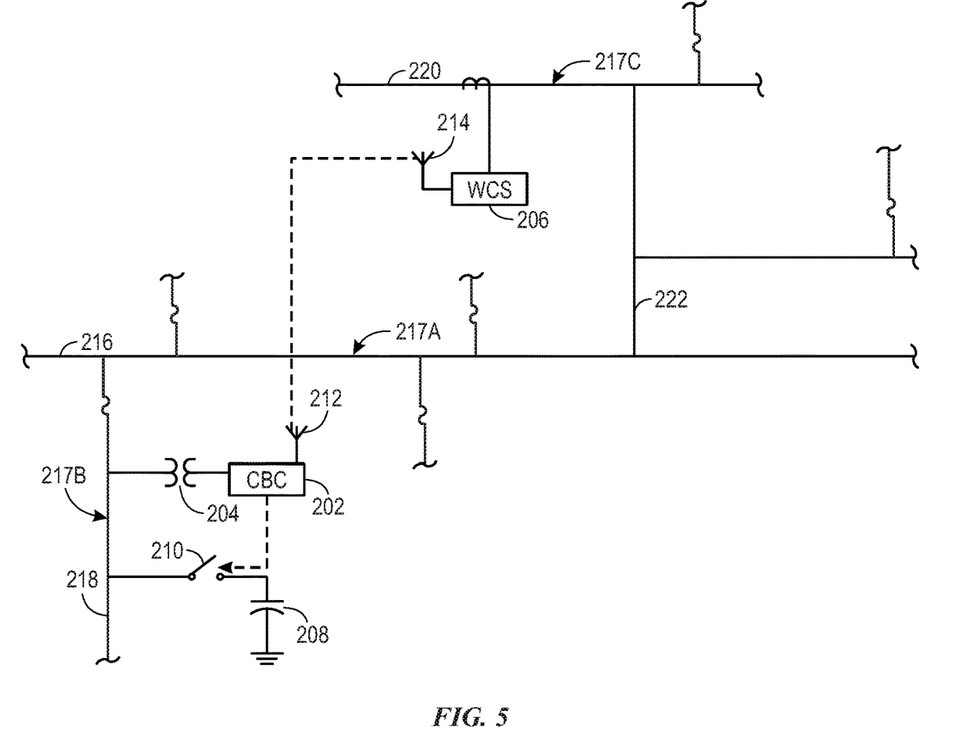
FIG. 5 is a one-line block diagram of a capacitor bank located on a lateral of a first feeder and controlled using electrical measurements from a wireless current sensor located on a second feeder, in accordance with an embodiment.

The wireless current sensors (WCSs) 206 may even be located at a site 217C on a feeder 220 that is separated from the feeder 216 by another lateral 222, as shown in FIG. 5. For purposes of this disclosure, the site 217C may represent a location having any suitable size (e.g., less than a meter along the feeder 220, between one meter and five meters along the feeder 220, between 5 meters and 10 meters along the feeder 220). Here, the capacitor bank controller (CBC) 202 and the capacitors 208 and switches 210 of the capacitor bank are located on the lateral 218 adjoining the feeder 216. The potential transformers 204 may obtain electrical measurements of voltage at the site 217B of the electric power distribution system along the lateral 218. At the same time, the wireless current sensors (WCSs) 206 may obtain electrical current measurements at the site 217C. The wireless current sensors (WCSs) 206 may transmit messages containing the measurements of electrical current from the antennas 214 of the wireless current sensors (WCSs) 206 to the antenna 212 of the capacitor bank controller (CBC) 202. In this way, the capacitor bank controller (CBC) 202 may use a closed-loop control method to control an aspect (e.g., VAR control) for the site 217C on the feeder 220, even while the capacitor bank controller (CBC) 202 and the capacitors 208 and switches 210 of the capacitor bank are located near the site 217B on the lateral 218 adjoining the feeder 216.

Figure 6:
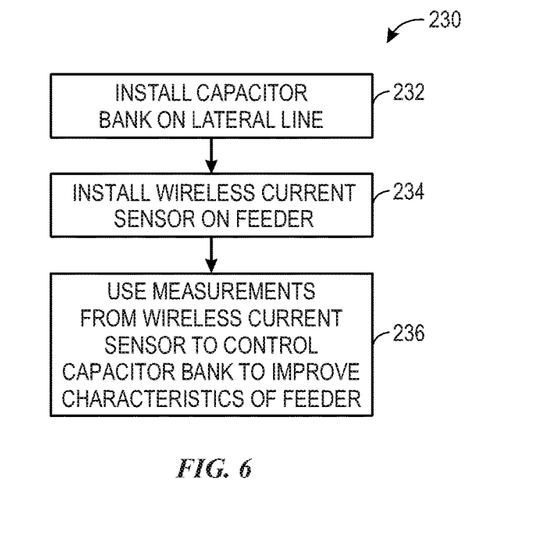
FIG. 6 is a flowchart of a method for controlling an electrical characteristic of a feeder using a capacitor bank on a lateral using electrical measurements from a wireless electrical measurement device on the feeder, in accordance with an embodiment.

A flowchart of FIG. 6 describes an example process 230 for using remotely located wireless electrical measurement devices, such as the wireless current sensors (WCSs) 206, to control a capacitor bank using an IED, such as the capacitor bank controller (CBC) 202. A capacitor bank may be installed on a lateral line (block 232). Meanwhile, wireless current sensors (WCSs) 206 may be installed at a site in the electric power distribution system where closed-loop control is desired, such as on a feeder (block 234). This may be particularly useful when the feeder may be too congested (e.g., there may be no poles with space to accommodate a capacitor bank, or there may be no available location to set a new pole). Since the wireless current sensors (WCSs) 206 may simply clamp around the electric power line of the feeder, they may avoid taking up space on a pole, while still providing electrical measurements at a valuable site. Thereafter, the capacitor bank controller (CBC) 202 on the lateral may use the electrical measurements of the feeder from the wireless current sensors (WCSs) 206 to improve electrical characteristics of the feeder (block 236). For example, the capacitor bank controller (CBC) 202 may maintain a target voltage-ampere-reactive (VAR) demand, power factor, or phase shift. For example, the capacitor bank controller (CBC) 202 may cause capacitors of the capacitor bank to be generally connected to the power line of the lateral when a higher level of compensation may be useful to maintain a target VAR demand of the feeder and then disconnected from the lateral when a lower level of compensation may be useful to maintain the target VAR demand of the feeder.

Figure 7A:
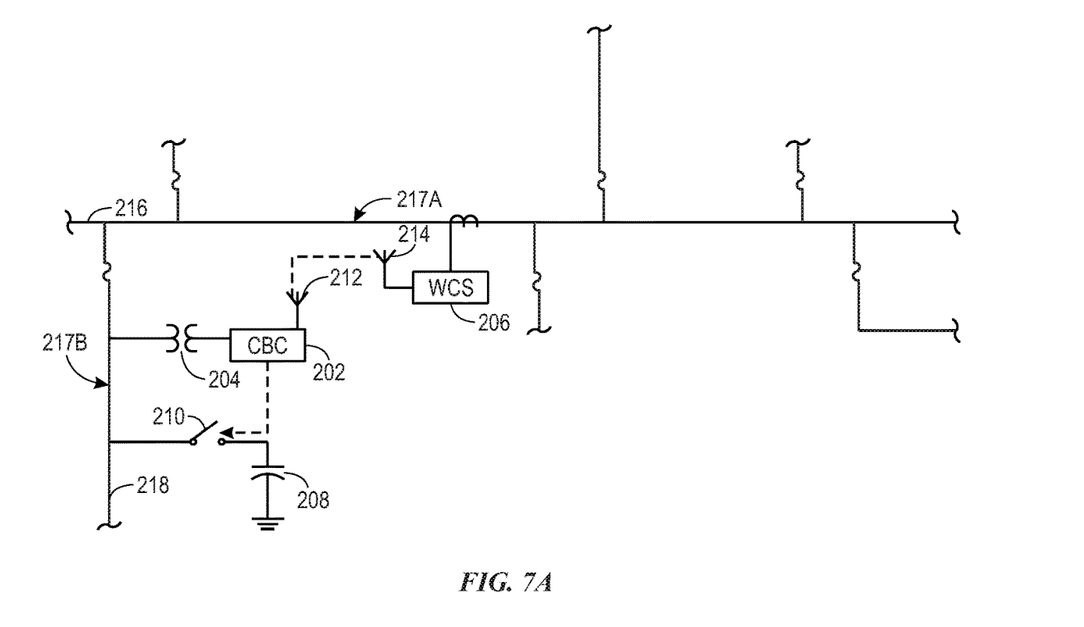
FIG. 7A is a one-line block diagram of a capacitor bank located on a lateral of a first feeder and controlled using electrical measurements from a wireless current sensor located on the first feeder, in accordance with an embodiment.
Figure 7B:
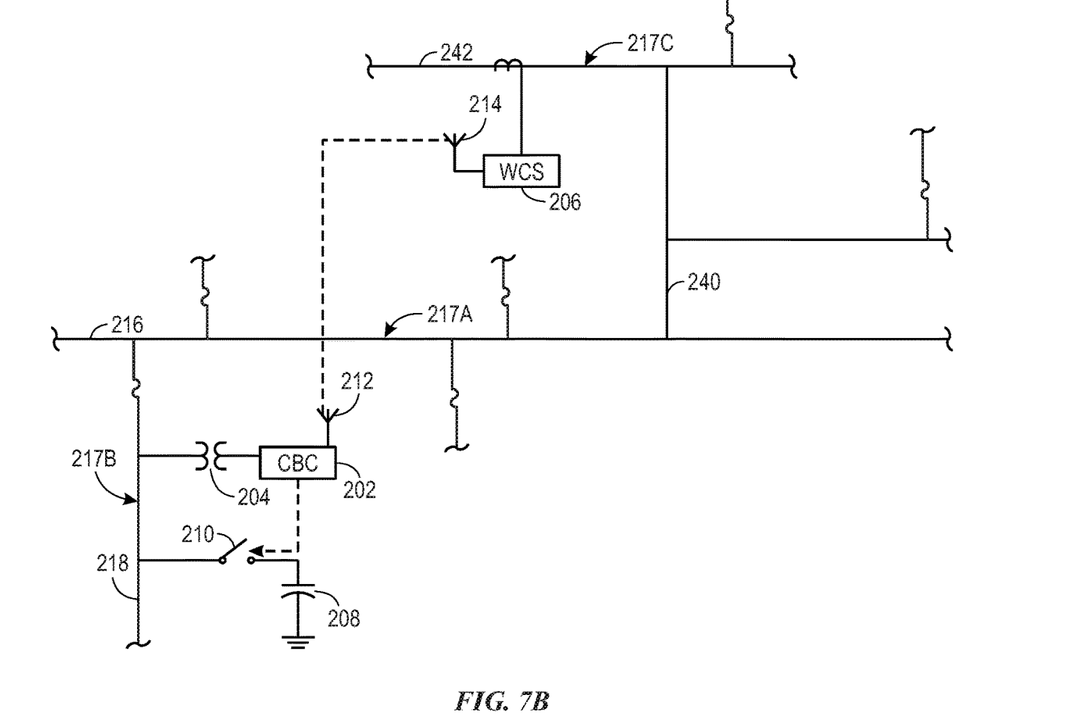
FIG. 7B is a one-line block diagram of the capacitor bank and the wireless current sensor of FIG. 7A after a period of urban growth, where the wireless current sensor has been moved to a second feeder that has since been installed, in accordance with an embodiment.

The use of wireless current sensors (WCSs) 206 to provide measurements to control a capacitor bank may also solve potential challenges due to urban growth, as illustrated by FIGS. 7A and 7B. In FIG. 7A, which represents an earlier phase in urban development, the wireless current sensors (WCSs) 206 may be located on the feeder 216 while the capacitor bank controller (CBC) 202 and the capacitors 208 and switches 210 of the capacitor bank are located on the lateral 218. The potential transformers 204 may obtain electrical measurements at the site 217B of the electric power distribution system along the lateral 218. The wireless current sensors (WCSs) 206 may obtain electrical current measurements at the site 217A. The wireless current sensors (WCSs) 206 may transmit messages containing the measurements of electrical current from the antennas 214 of the wireless current sensors (WCSs) 206 to the antenna 212 of the capacitor bank controller (CBC) 202. Thus, the capacitor bank controller (CBC) 202 may use a closed-loop control method to control an aspect (e.g., VAR control) for the site 217A on the feeder 216, even while the capacitor bank controller (CBC) 202 and the capacitors 208 and switches 210 of the capacitor bank are located near the site 217B on the lateral 218.

The electric power distribution system may grow as the city grows. An example of this growth is shown in FIG. 7B, which represents a later phase in urban development. In FIG. 7B, additional laterals, such as a lateral 240, and feeders, such as a feeder 242, have been installed to accommodate new development. Some of this new development could cause the site 217C on the feeder 242 to present a greater effect on an aspect of feeder 216 than the site 217A on the feeder 216. For example, the voltage on the feeder 216 may become more sensitive to changes in the magnitude of loads near the site 217C than to changes in the magnitude of loads near the site 217A. For, example the presence or absence of reactive loads near site 217C on the feeder 242 may present a greater effect on the VAR demand of feeder 216 and/or feeder 242 than other loading conditions at site 217A on the feeder 216. In these cases, the wireless current sensor (WCS) 206 may simply be removed from the site 217A and placed at the site 217C. Thereafter, the capacitor bank controller (CBC) 202 may use a closed-loop control method to control an aspect (e.g., VAR control) for the site 217C on the feeder 242, even while the capacitor bank controller (CBC) 202 and the capacitors 208 and switches 210 of the capacitor bank are located near the site 217B on the lateral 218.

Figure 8:
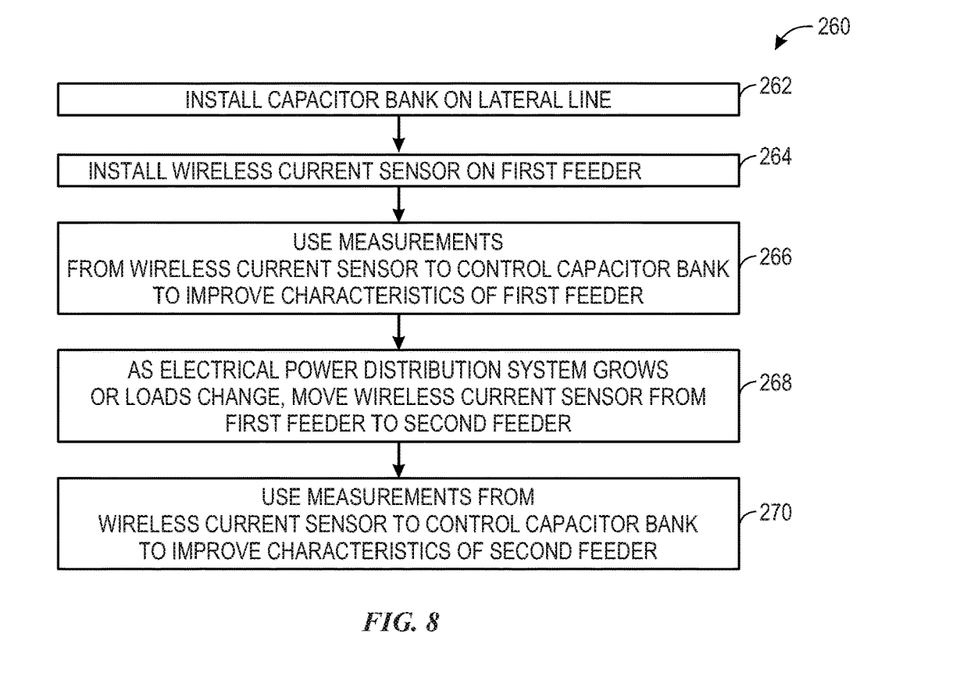
FIG. 8 is a flowchart of a method for controlling an electrical characteristic of a first feeder using a capacitor bank on a lateral at a first point in time and controlling an electrical characteristic of a second feeder using the capacitor bank on the lateral at a second point in time, in accordance with an embodiment.

A flowchart of FIG. 8 describes an example process 260 for using remotely located wireless electrical measurement devices to accommodate urban growth. During an earlier phase of urban development, a capacitor bank may be installed on a lateral line adjoining a first feeder (block 262). Meanwhile, wireless current sensors (WCSs) 206 may be installed at a site in the electric power distribution system where closed-loop control is desired, such as on the first feeder adjoining the lateral (block 264). Thereafter, the capacitor bank controller (CBC) 202 on the lateral may use the electrical measurements of the first feeder from the wireless current sensors (WCSs) 206 to improve electrical characteristics of the first feeder (block 266). For example, the capacitor bank controller (CBC) 202 may maintain a target voltage-ampere-reactive (VAR) demand, power factor, or phase shift.

To accommodate urban growth, the electric power distribution system may grow accordingly. As new feeders are added to accommodate new loads (e.g., new factories, homes, office buildings), a second feeder accommodating these new loads may become a greater focus of interest than the first feeder. As such, the wireless current sensors (WCSs) 206 may be removed from the site on the first feeder, and reinstalled at a site on the second feeder (block 268). Thereafter, the capacitor bank controller (CBC) 202 on the lateral may use the electrical measurements of the second feeder from the wireless current sensors (WCSs) 206 to improve electrical characteristics of the second feeder (block 270).

Figure 9:
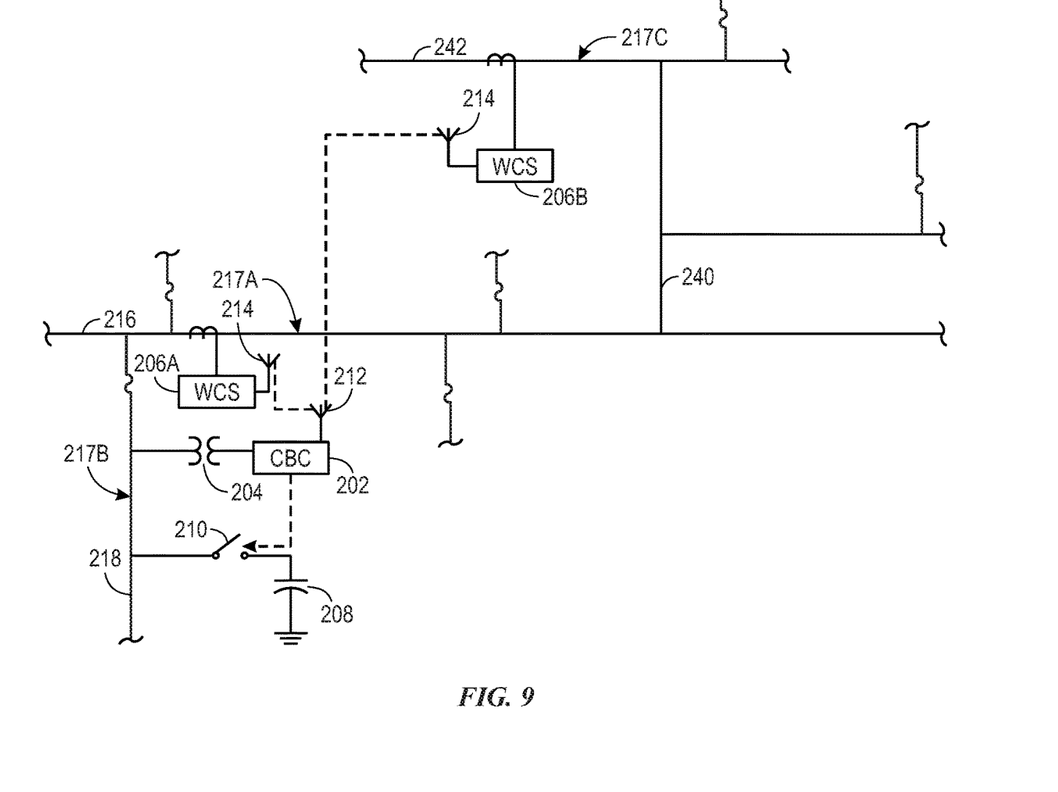
FIG. 9 is a one-line block diagram of a capacitor bank located on a lateral of a first feeder and controlled using electrical measurements from a first wireless current sensor located on the first feeder and/or a second wireless current sensor located on a second feeder, in accordance with an embodiment.

Wireless current sensors (WCSs) 206 may also be placed at multiple sites. As shown in FIG. 9, a first set of wireless current sensors (WCSs) 206A may be located at the site 217A on the first feeder 216 and a second set of wireless current sensors (WCSs) 206B may be located at the site 217C on the second feeder 242. Meanwhile, the capacitor bank controller (CBC) 202 and the capacitors 208 and switches 210 of the capacitor bank may be located on the lateral 218. The potential transformers 204 may obtain electrical measurements at the site 217B of the electric power distribution system along the lateral 218. The wireless current sensors (WCSs) 206A may obtain electrical current measurements at the site 217A and the wireless current sensors (WCSs) 206B may obtain electrical current measurements at the site 217C. The wireless current sensors (WCSs) 206A and 206B may transmit messages containing the measurements of electrical current from the antennas 214 of the wireless current sensors (WCSs) 206A and 206B to the antenna 212 of the capacitor bank controller (CBC) 202. The capacitor bank controller (CBC) 202 may use a closed-loop control method to control an aspect (e.g., VAR control) for the site 217A on the first feeder 216, the site 217C on the second feeder 242, or some mix of the two sites 217A and 217C.

Figure 10:
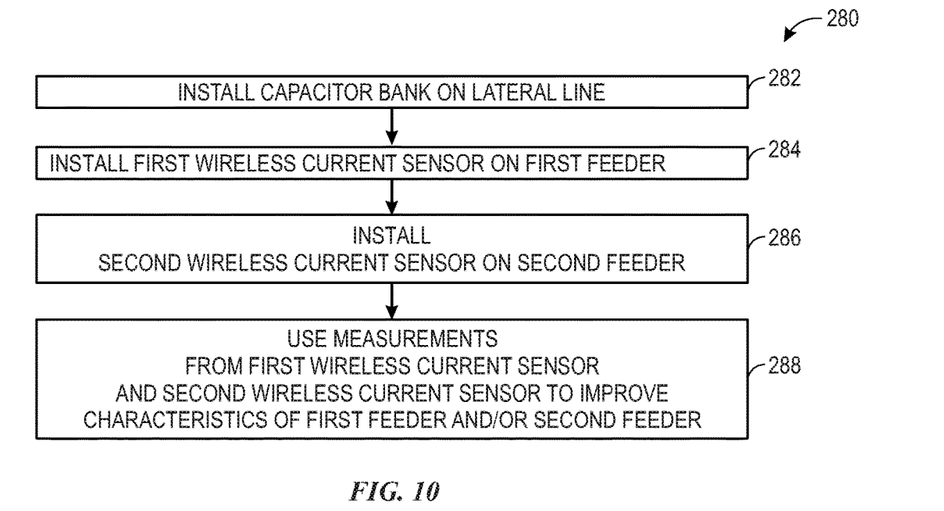
FIG. 10 is a flowchart of a method for controlling an electrical characteristic of a first feeder and/or a second feeder using a capacitor bank on a lateral using, in accordance with an embodiment.

A flowchart of FIG. 10 describes an example process 280 for using two remotely located sets of wireless electrical measurement devices. A capacitor bank may be installed on a lateral line adjoining a first feeder (block 282). Meanwhile, a first set of wireless current sensors (e.g., wireless current sensors (WCSs) 206A) may be installed at a first site in the electric power distribution system where closed-loop control is desired, such as on the first feeder adjoining the lateral (block 284). A second set of wireless current sensors (e.g., wireless current sensors (WCSs) 206A) may be installed at a second site in the electric power distribution system where closed-loop control is desired, such as on the second feeder coupled to the lateral via other laterals and/or the first feeder (block 286). Thereafter, the capacitor bank controller (CBC) 202 on the lateral may use the electrical measurements of the first feeder from the first set of wireless current sensors (WCSs) and/or the electrical measurements of the second feeder from the second set of wireless current sensors (WCSs) to improve electrical characteristics of the first feeder and/or the second feeder (block 286). For example, the capacitor bank controller (CBC) 202 may maintain a target voltage-ampere-reactive (VAR) demand, power factor, or phase shift.

Figure 11:
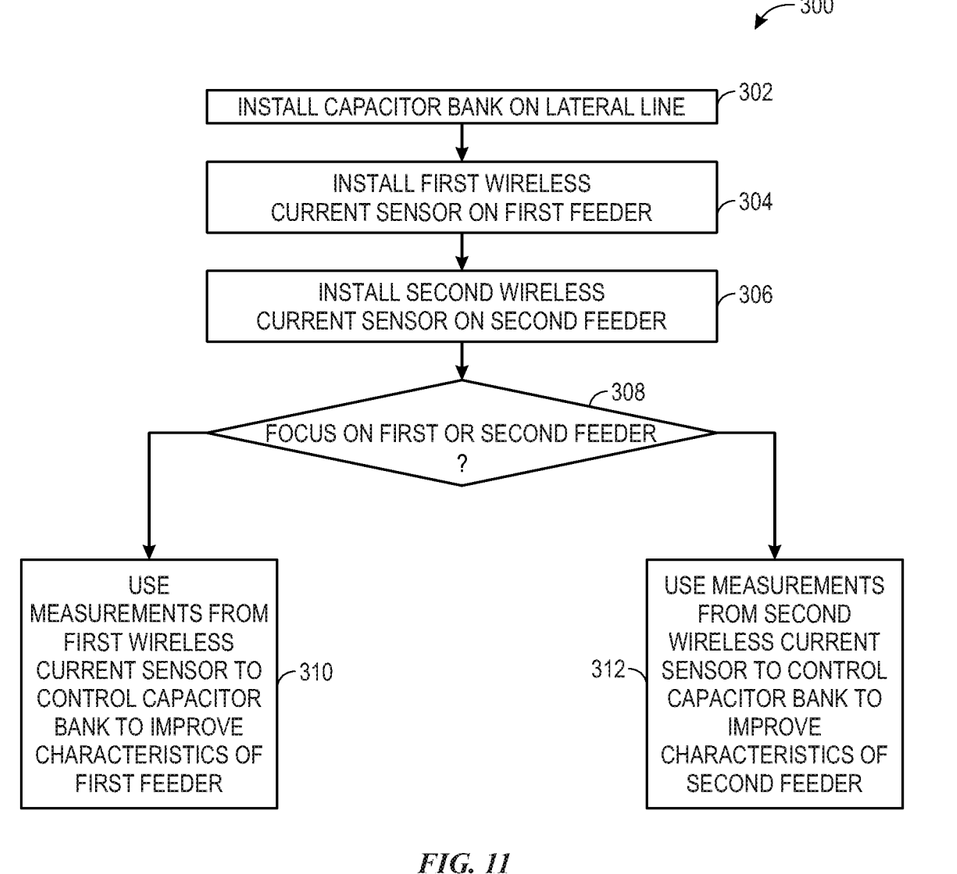
FIG. 11 is a flowchart of a method for selectively controlling an electrical characteristic of a first feeder or a second feeder using a capacitor bank on a lateral, in accordance with an embodiment.

Using multiple sets of wireless electrical measurement devices may also allow for a shift of control focus on different parts of the electric power distribution system at different points in time (e.g., different times of day, different days of the week, during abnormal switching, or upon certain demand events). A flowchart of FIG. 11 describes an example process 300 for using two remotely located sets of wireless electrical measurement devices to change control focus as desired. The process 300 may begin as a capacitor bank is installed on a lateral line adjoining a first feeder (block 302). Meanwhile, a first set of wireless current sensors (e.g., wireless current sensors (WCSs) 206A) may be installed at a first site in the electric power distribution system where closed-loop control is desired, such as on the first feeder adjoining the lateral (block 304). A second set of wireless current sensors (e.g., wireless current sensors (WCSs) 206A) may be installed at a second site in the electric power distribution system where closed-loop control is desired, such as on the second feeder coupled to the lateral via other laterals and/or the first feeder (block 306). If focus is desired on the first feeder (block 308) due, for example, to a programmed schedule or a demand event occurring on the first feeder, the capacitor bank controller (CBC) 202 on the lateral may use the electrical measurements of the first feeder from the first set of wireless current sensors (WCSs) to improve electrical characteristics of the first feeder (block 310). For example, the capacitor bank controller (CBC) 202 may maintain a target voltage-ampere-reactive (VAR) demand, power factor, or phase shift. If focus is desired on the second feeder (block 308) due, for example, to a programmed schedule or a demand event occurring on the second feeder, the capacitor bank controller (CBC) 202 on the lateral may use the electrical measurements of the second feeder from the second set of wireless current sensors (WCSs) to improve electrical characteristics of the second feeder (block 312).

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may or may not include long-distance transmission of high-voltage power. Accordingly, many changes may be made to the details of the above-described embodiments without departing from the underlying principles of this disclosure. The scope of the present disclosure should, therefore, be determined only by the following claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . ." or "step for [perform]ing [a function] . . .", it is intended that such elements are to be interpreted under 35 U.S.C. 112(f). For any claims containing elements designated in any other manner, however, it is intended that such elements are not to be interpreted under 35 U.S.C. 112(f).

What is claimed is:
1. A system comprising:
a capacitor bank configured to be coupled to a lateral of an electric power delivery system, wherein the lateral is between a first feeder and a load;
a first set of one or more wireless electrical measurement devices configured to couple to a location on the first feeder of the electrical power delivery system and obtain one or more electrical measurements of current of the first feeder; and a capacitor bank controller configured to receive the one or more electrical measurements of current of the first feeder from the first set of one or more wireless electrical measurement devices; obtain electrical measurements of voltage of the lateral; and control the capacitor bank using the electrical measurements of voltage of the lateral and the electrical measurements of current of the first feeder for volt-ampere-reactive (VAR) control.

2. The system of claim 1, wherein the lateral directly adjoins the first feeder.

3. The system of claim 1, wherein the lateral does not directly adjoin the first feeder.

4. The system of claim 3, wherein the lateral directly adjoins a second feeder that is electrically coupled to the first feeder.

5. The system of claim 1, wherein the first set of one or more wireless electrical measurement devices comprises one or more wireless current sensors.

6. The system of claim 1, wherein the capacitor bank controller is configured to use the one or more electrical measurements to control the capacitor bank using a closed-loop method to control an electrical characteristic of the first feeder.

7. The system of claim 6, wherein the closed-loop method controls the electrical characteristic of the first feeder, wherein the electrical characteristic comprises VAR demand of the first feeder.

8. The system of claim 1, comprising a second set of one or more wireless electrical measurement devices configured to couple to a second feeder of the electric power delivery system and obtain one or more electrical measurements of the second feeder, wherein the capacitor bank controller is configured to also receive the one or more electrical measurements of the second feeder from the second set of one or more wireless electrical measurement devices and control the capacitor bank using the one or more electrical measurements of the second feeder.

9. The system of claim 8, wherein the capacitor bank controller is configured to use the one or more electrical measurements of the first feeder or the one or more electrical measurements of the second feeder to control the capacitor bank using a closed-loop method to selectively control an electrical characteristic of the first feeder or of the second feeder.

10. A method comprising:
installing a capacitor bank onto a lateral of an electric power delivery system, wherein the lateral is between a first feeder and a load;
installing a first wireless current sensor on a location on the first feeder of the electric power delivery system, wherein the first wireless current sensor is configured to obtain current measurements from the first feeder; and
configuring a capacitor bank controller to obtain electrical measurements of voltage of the lateral and control the capacitor bank on the lateral for volt-ampere-reactive (VAR) conditions using
wireless electrical measurements of current of the first feeder obtained by the first wireless current sensor on the first feeder; and,
the electrical measurements of voltage of the lateral.

11. The method of claim 10, comprising:
removing the first wireless current sensor from the first feeder of the electric power delivery system;
installing the first wireless current sensor on a second feeder of the electric power delivery system; and
configuring the capacitor bank controller to control the capacitor bank using wireless electrical measurements obtained by the first wireless current sensor on the second feeder.

12. The method of claim 10, comprising:
installing a second wireless current sensor on a second feeder of the electric power delivery system; and
configuring the capacitor bank controller to control the capacitor bank using wireless electrical measurements obtained by the first wireless current sensor on the first feeder and the second wireless current sensor on the second feeder.

13. The method of claim 10, comprising:
installing a second wireless current sensor on a second feeder of the electric power delivery system; and
configuring the capacitor bank controller to:
at a first time, control the capacitor bank using wireless electrical measurements obtained by the second wireless current sensor on the second feeder; and
at a second time, control the capacitor bank using wireless electrical measurements obtained by the first wireless current sensor on the first feeder.

14. The method of claim 10, comprising controlling the capacitor bank on the lateral using the wireless electrical measurements obtained by the first wireless current sensor on the first feeder.

* * * * *